United States Patent [19]
Jeuch

[11] Patent Number: 4,703,454
[45] Date of Patent: Oct. 27, 1987

[54] CMOS STATIC STORAGE CELL HAVING NONCROSSING INTERCONNECTION CONDUCTORS
[75] Inventor: Pierre Jeuch, Seyssins, France
[73] Assignee: Commissariat a l'Energie Atomique, Paris, France
[21] Appl. No.: 750,517
[22] Filed: Jul. 1, 1985
[30] Foreign Application Priority Data
  Jul. 5, 1984 [FR] France ............... 84 10674
[51] Int. Cl.$^4$ ............... G11C 11/00; G11C 5/02
[52] U.S. Cl. ............... 365/154; 365/51
[58] Field of Search ............... 365/154, 156, 190, 51
[56] References Cited
U.S. PATENT DOCUMENTS
  4,075,690 2/1978 Oberman et al. ............... 365/156
  4,513,398 4/1985 Ngu ............... 365/154
  4,631,705 12/1986 Honda ............... 365/154

FOREIGN PATENT DOCUMENTS
  0104616 9/1983 European Pat. Off. .

Primary Examiner—Terrell W. Fears
Assistant Examiner—Melissa J. Koval
Attorney, Agent, or Firm—Pearne, Gordon, McCoy & Granger

[57] ABSTRACT

The storage cell comprises a bistable element formed from two channel P MOS transistors called first and second transistors, and two channel N MOS transistors, called third and fourth transistors, a fifth and a sixth channel N MOS transistor being used for controlling the bistable element, the different transistors of the cell being electrically interconnected in such a way that the interconnection lines used for connecting them do not cross.

5 Claims, 8 Drawing Figures

CMOS STATIC STORAGE CELL HAVING NONCROSSING INTERCONNECTION CONDUCTORS

BACKGROUND OF THE INVENTION

The present invention relates to a CMOS static storage cell. It can be used in the microelectronics field for producing random access memories, particularly for storing binary information.

CMOS (complementary metal-oxide-semiconductors) static memories or stores, constituted solely by MOS transistors with a N channel and MOS transistors with a P channel have the advantage of consuming very little electric power and of having a high immunity to interference, particularly that of an electrical nature. However, they have a relatively low integration density.

This low integration density is particularly due to the presence in each storage cell of several electric contact holes necessary for the interconnections of the various transistors forming a storage cell. These contact holes are formed in an insulating layer, particularly of silicon oxide, deposited on the complete circuit. A further problem is caused by the guards necessary for the positioning of these contact holes. This is illustrated by the attached FIGS. 1 and 2, which respectively show the electrical diagram of a CMOS storage cell according to the prior art, and in plan view the organization of the various layers constituting this cell.

The storage cell comprises a bistable element or flip-flop 2 formed from two MOS transistors $T_1$ and $T_2$ with a P channel and two MOS transistors $T_3$ and $T_4$ with a N channel, which are electrically interconnected.

This storage cell also comprises two MOS transistors $T_5$ and $T_6$ with a N channel constituting the transistors for operating the bistable element 2 of the cell.

As shown in FIGS. 1 and 2, the sources $S_1$ and $S_2$ of transistors $T_1$ and $T_2$ are interconnected by means of an interconnection line 4, diffused in the substrate on which the cell is formed, and are raised to a positive potential V supplied by a not shown, electric power source. Moreover, the gates of transistors $T_1$ and $T_3$, designated $G_1$ and $G_3$ (FIG. 1) are electrically interconnected, and so are gates $G_2$ and $G_4$ of transistors $T_2$ and $T_4$.

The connection of the gates of transistors $T_1$ and $T_3$ is brought about by means of an interconnection line 6 and the connection of the gates of transistors $T_2$ and $T_4$ by means of interconnection line 8, said lines 6 and 8 being formed (FIG. 2) in an etched conductive layer 9, generally of polycrystalline silicon, which also is used for producing the various gates.

Moreover, as shown in FIG. 1, the drain $D_1$ of transistor $T_1$ is electrically connected to drain $D_3$ of transistor $T_3$, as well as to the gates $G_2$ and $G_4$ of transistors $T_2$ and $T_4$.

These connections, as shown in FIG. 2, are obtained by means of three electric contact holes 10, 12, 14, formed in an insulating material layer particularly silicon oxide (not shown). An interconnection line 16 formed in the more particularly aluminum conductive layer 18 ensures the connection between the drain $D_1$ of transistor $T_1$ and the drain $D_3$ of transistor $T_3$, said line 16 being respectively in contact with drain $D_1$ and drain $D_3$ by means of electric contact holes 10 and 14, as well as an interconnection line 19 formed in the etched conductive layer 9 which ensures the connection of active zones $D_1$ and $D_3$ to the gates of transistors $T_2$ and $T_4$, said line 19 being in contact with line 16 as a result of contact hole 12 made in said line 16.

In the same way as shown in FIG. 1, the drain $D_2$ of transistor $T_2$ is electrically connected by drain $D_4$ of transistor $T_4$ as well as to gates $G_1$ and $G_3$ of transistors $T_1$ and $T_3$.

As shown in FIG. 2, these connections are produced by means of three electric contact holes 20, 22, 24, formed in the insulating material layer. An interconnection line 26 formed in conductive layer 18 ensures the connection between drain $D_2$ of transistor $T_2$ and drain $D_4$ of transistor $T_4$, said line 26 being respectively in contact with drain $D_2$ and drain $D_4$ as a result of electric contact holes 20, 24, as well as an interconnection line 28 formed in the conductive layer 9 and ensuring the connection between active zones $D_2$, $D_4$ and the gates of transistors $T_1$, $T_3$, said line 28 being in contact with line 26 as a result of the contact hole 22 formed in said line 26.

Furthermore, sources $S_3$, $S_4$ of transistors $T_3$, $T_4$ are raised to earth potential (FIG. 1). These connections are assured by means of interconnection lines 30, 32, formed in the conductive coating 18, which are respectively in contact with sources $S_3$, $S_4$ of transistors $T_3$, $T_4$ via electric contact holes 34, 36 (FIG. 2), formed in the insulating layer.

As shown in FIG. 1, the activation of bistable element 2 of the storage cell is brought about by transistor $T_5$, connected by its drain $D_5$ to drain $D_3$ of transistor $T_3$, to drain $D_1$ of transistor $T_1$ and to gates $G_2$, $G_4$ of transistors $T_2$, $T_4$, or by transistor $T_6$, whose drain $D_6$ is connected to drain $D_4$ of transistor $T_4$, to drain $D_2$ of transistor $T_2$ as well as to gates $G_1$, $G_3$ of transistors $T_1$, $T_3$.

The connection between drain $D_5$ of transistor $T_5$ and drain $D_3$ of transistor $T_3$ is, as shown in FIG. 2, assured by an interconnection line 38 diffused in the substrate, whilst the connection between drain $D_6$ of connection $T_6$ and $D_4$ of transistor $T_4$ is assured by an interconnection line 40 diffused in the substrate. The other connections of drains $D_5$, $D_6$ of transistors $T_5$, $T_6$ are, as hereinbefore, provided by electric contact holes respectively 10, 12, 14 and 20, 22, 24 and the interconnection lines respectively 16, 19, 8, and 26, 28, 6.

The electric signals used for the selection of the storage cell are transmitted to gates $G_5$, $G_6$ of transistors $T_5$, $T_6$, which are electrically interconnected by interconnection line 42, formed in conductive layer 9, whilst the information to be stored in the selected storage cell or to be removed from said cell are transmitted by sources $S_5$ and $S_6$ of transistors $T_5$ and $T_6$. This information is carried by lines 44, 46 formed in the conductive layer 18 and in contact respectively with sources $S_5$, $S_6$ of transistors $T_5$, $T_6$, via electric contact holes 48, 50 (FIG. 2) and in the insulating layer and a second, more particularly aluminum conductive layer (not shown).

The presence of these six electric contact holes 10, 12, 14, 20, 22 and 24, which are necessary for producing the internal connections of the CMOS storage cell, bearing in mind the organization of the different layers constituting this cell, and particularly the crossing of the interconnection lines formed in the conductive layers 9, 18, limits the integration density of the storage cell.

SUMMARY OF THE INVENTION

The present invention relates to a CMOS static storage cell having an organization different from that of the prior art storage cells and which makes it possible to eliminate all the electric contact holes used for the internal connections of storage cells according to the prior art, so that the integration density of such cells can be increased.

More specifically the present invention invention relates to a CMOS static storage cell comprising in per se known manner a bistable element, formed from two channel P MOS transistors, called the first and second transistors, as well as two channel N MOS transistors, called the third and fourth transistors, a fifth and sixth channel MOS transistors being used for controlling the bistable element. It is characterized in that the different transistors of the cell are electrically interconnected in such a way that the interconnection lines for connecting these do not cross.

As a result of the non-crossing of the interconnections lines of the various transistors forming the cell, it is possible to eliminate all the electric contact holes within the cell and thus increase the integration density.

Advantageously, the connections of the transistors of the bistable element of the cell according to the invention are realized in such a way that:

the gates of the first and third transistors are interconnected, the gates of the second and fourth transistors are interconnected, the sources of the first and second transistors are connected to one another and to an electric power supply, the sources of the third and fourth transistors are connected to earth, the drain of the first transistor is connected to the gate of the second transistor, the drain of the second transistor is connected to the gates of the first and third transistors, as well as to the drain of the fourth transistor, and the drain of the third transistor is connected, in the bistable element, to the gate of the fourth transistor.

According to a preferred embodiment of the storage cell according to the invention, the drains of the fifth and sixth transistors are respectively connected to the gate of the third transistor and to the gate of the fourth transistor, the gates of the fifth and sixth transistors, which are interconnected, being used for carrying the cell selection signals and the sources of these fifth and sixth transistors are used for carrying the information to be stored or read.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
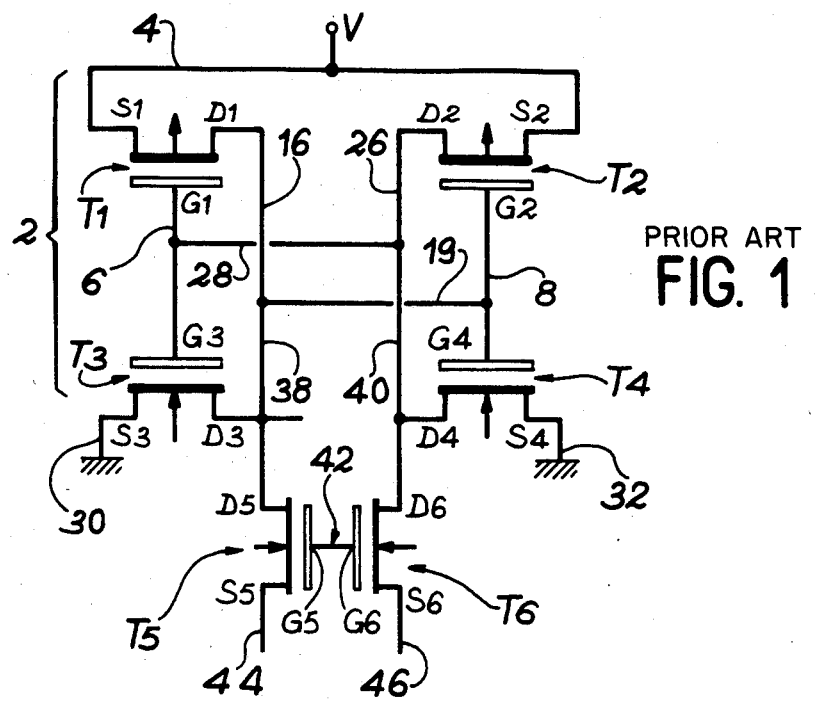
FIG. 1, already described, the electric diagram of a prior art CMOS static storage cell.
Figure 3:
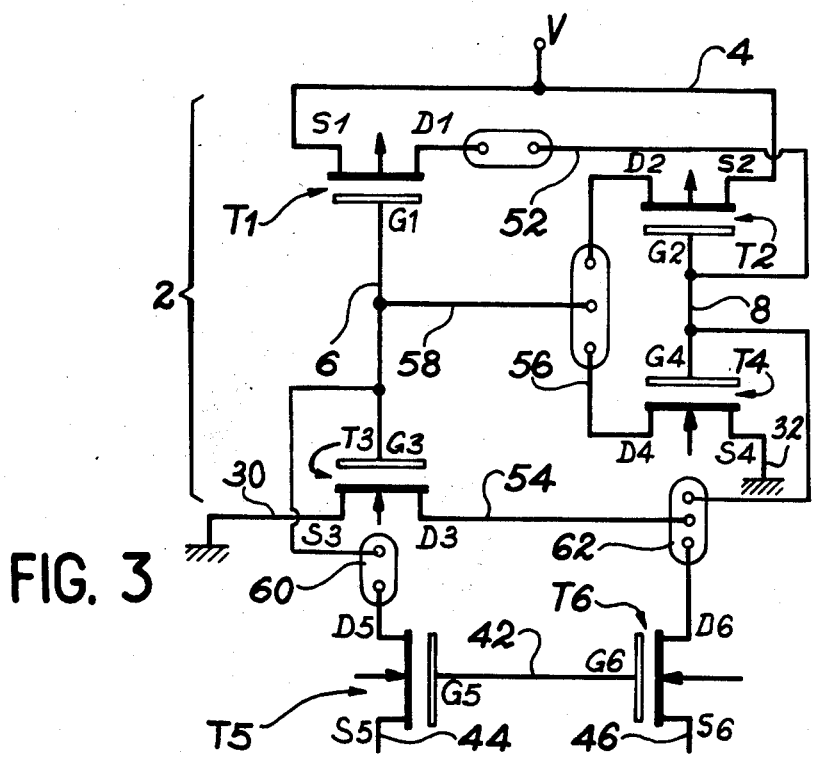
FIG. 3 the electric diagram of a CMOS static storage cell according to the invention.
Figure 2:
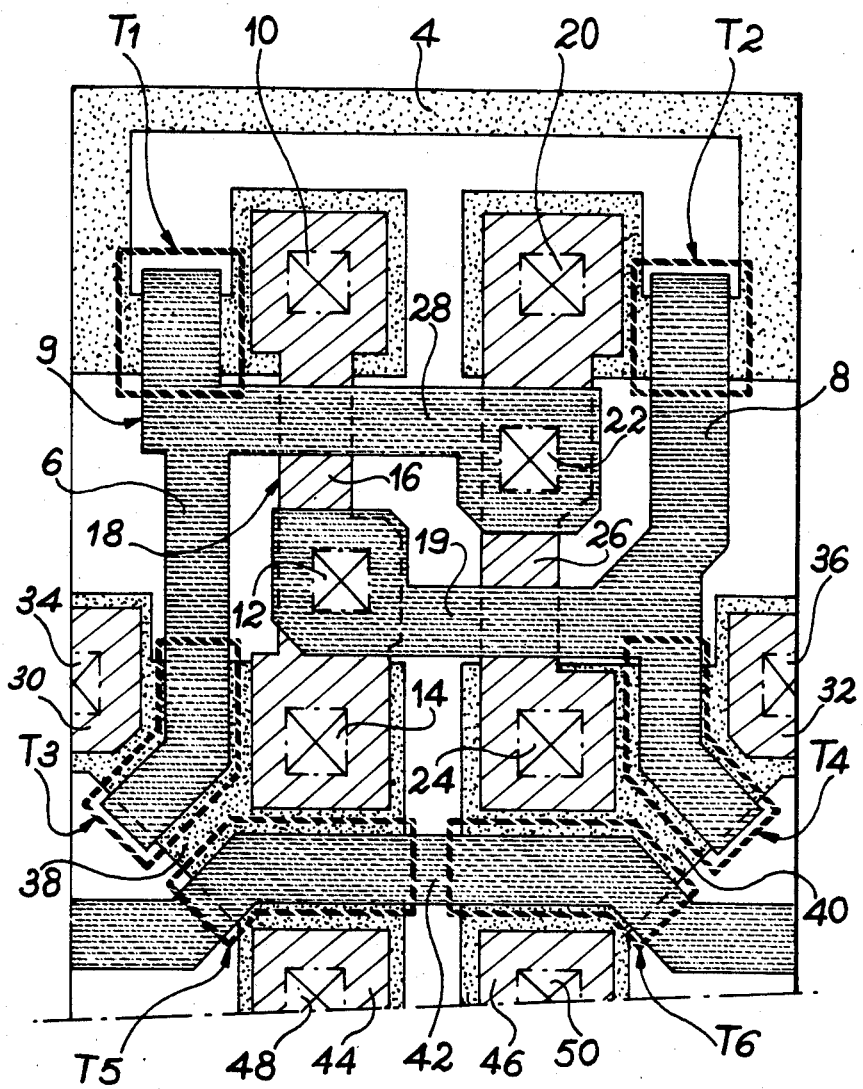
FIG. 2 already described, in plan view the organization of the various layers constituting the cell of FIG. 1.
Figure 4:
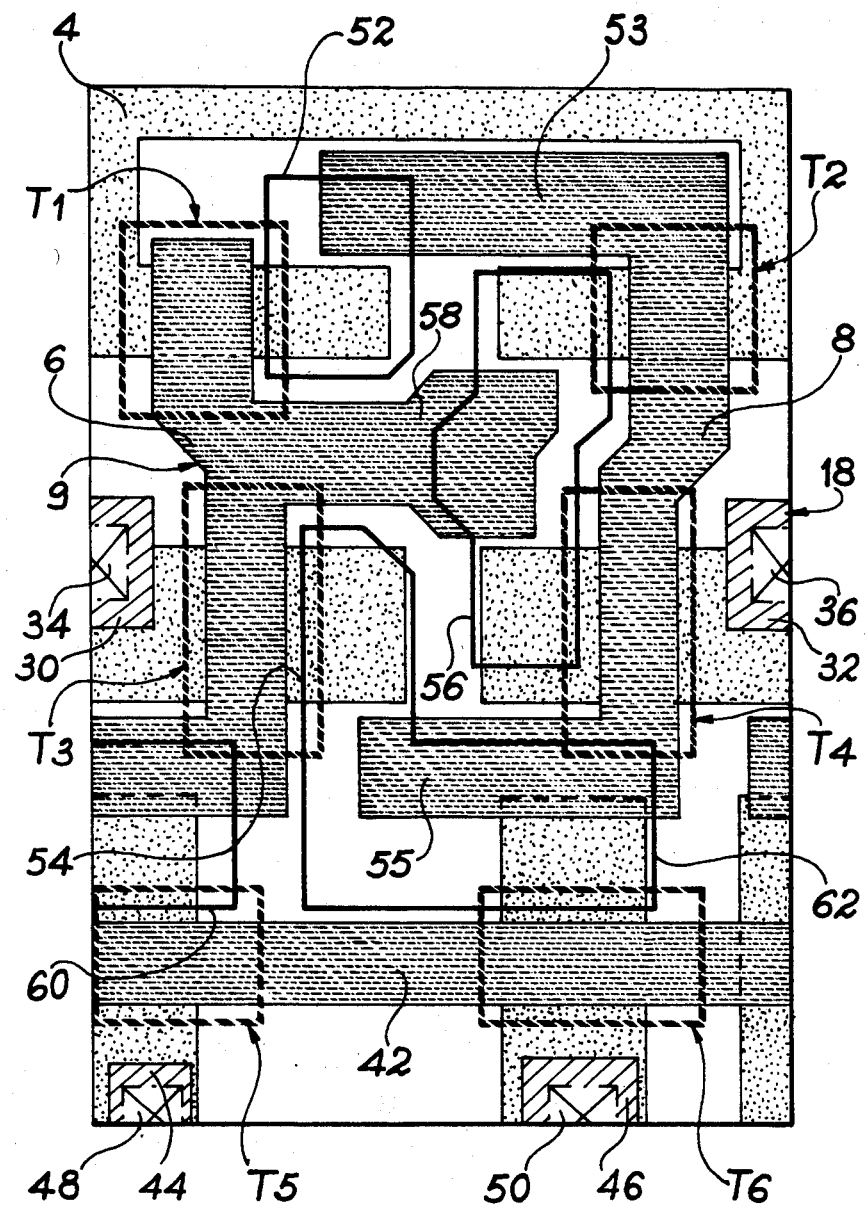
FIG. 4 in plan view, the organization of the various layers constituting the cell of FIG. 3.

With a view to the simplification and the good understanding of the following description, the elements of the storage cell according to the invention as shown in FIGS. 3 and 4 and which remain unchanged with respect to the prior art described with reference to FIGS. 1 and 2, will carry the same references.

As hereinbefore, the cell according to the invention comprises a bistable element or flip-flop 2 formed from two channel P MOS transistors $T_1$ and $T_2$, and two channel N MOS transistors $T_3$ and $T_4$, which constitute the control transistors of the cell, together with two transistors $T_5$, $T_6$ for activating the bistable element and which are constituted by channel N MOS transistors.

As in the prior art cells, sources $S_1$ and $S_2$ of transistors $T_1$ and $T_2$ are electrically interconnected by means of an interconnection line 4 diffused in the substrate in which the cell is formed, and which are raised to a positive potential V supplied by an electric power supply. Moreover, the gates $G_1$ and $G_3$ of transistors $T_1$ and $T_3$ are electrically interconnected by means of interconnection line 6 and the gates $G_2$, $G_4$ of transistors $T_2$, $T_4$ are also interconnected by means of interconnection line 8, whereby, as hereinbefore, lines 6 and 8 are formed in the etched conductive layer 9, which more particularly of polycrystalline silicon, used for producing the gates of the transistors of the cell according to the invention.

Moreover, as in the prior art, sources $S_3$ and $S_4$ of transistors $T_3$ and $T_4$ are raised to earth potential (FIG. 3). These connections are provided by means of interconnection lines 30, 32, formed in the in particular aluminum conductive layer 18 and which are respectively in contact with sources $S_3$, $S_4$ via electric contact holes 34 and 36 (FIG. 4), formed in the more particularly silicon oxide insulating layer (not shown).

Finally, as in the prior art, gates $G_5$, $G_6$ of transistors $T_5$, $T_6$ by which the storage cell selection signals arrive are electrically interconnected (FIG. 3) by means of interconnection line 42; formed in the conductive layer 9 and sources $S_5$, $S_6$ of said transistors $T_5$, $T_6$ respectively to interconnection lines 44, 46, which are used for carrying the information to be stored or to be extracted from the storage cell. Lines 44 46 formed in the conductive layer 18 are respectively in contact with sources $S_5$, $S_6$ via electric contact holes 48, 50 (FIG. 4).

According to the invention, drain $D_1$ of transistor $T_1$ is connected to gate $G_2$ of transistor $T_2$ (FIG. 3) by the uninsulated interconnection line 52, which is in direct contact with drain $D_1$ and with an extension 53 of gate $G_2$ formed in conductive layer 9 (FIG. 4). In the same way, drain $D_3$ of transistor $T_3$ is connected to the gate of transistor $T_4$ (FIG. 3) by means of an uninsulated interconnecting line 54, with direct contact with drain $D_3$ and an extension 55 of gate $G_4$, formed in layer 9 (FIG. 4).

Moreover, drain $D_2$ of transistor $T_2$ is connected to drain $D_4$ of transistor $T_4$, as well as to gates $G_1$, $G_3$ of transistors $T_1$, $T_3$ (FIG. 3). These connections are provided by means of an uninsulated interconnection line 56, which is in direct contact with drain $D_2$ and drain $D_4$, as well as with extension 58 of the interconnection line 6 connecting the gates of transistors $T_1$, $T_3$ (FIG. 4).

Moreover, according to the invention, the activation of bistable element or flip-flop 2 by transistors $T_5$, $T_6$ takes place either through drain $D_5$ of transistor $T_5$ connected to gate $G_3$ of transistor $T_3$ (FIG. 3) by means of uninsulated interconnection lines 60 in direct contact with drain $D_5$ and gate $G_3$ of the corresponding transistors, or through drain $D_6$ of transistor $T_6$ connected to gate $G_4$ of transistor $T_4$ by means of the insulated interconnection line 62, which is in direct contact with drain $D_6$ and gate $G_4$ of the corresponding transistors (FIG. 4).

The uninsulated interconnection lines 52, 54, 56, 60 and 62 are formed in the same conductive layer, which is more particularly formed from a titanium - tungsten alloy. Their production process will be described hereinafter.

As shown in FIGS. 3 and 4, the different internal connections of storage cell according to the invention never cross. In particular, the uninsulated interconnection lines never cross the interconnection lines diffused in the substrate, or the interconnection lines formed in conductive layer 9, in which the gates are formed.

The organization of the static storage cell according to the invention makes it possible, as a result of the formation of the internal connections thereof without employing an insulating layer, to eliminate all the electric contact holes normally used for the connection of transistors of the prior art cell.

One of the processes making it possible to electrically interconnect the transistors of the storage cell, without producing electric contact holes, formed in an insulating material layer and which in particular makes it possible to produce interconnection lines 52, 54, 56, 60, 62 has been described in French Pat. No. 2,564,443 in the name of the present Applicant. This process will be described with reference to FIGS. 5 to 8 which, in longitudinal section, show the different stages of the process.

In order to simplify the description, this will be done in order to permit the connection of drain $D_2$ of transistor $T_2$ to drain $D_4$ of transistor $T_4$, by means of line 56. However, this process is obviously also applicable to all uninsulated connections, i.e. without an electric contact hole, of the storage cell according to the invention.

In FIGS. 5 to 8, reference 72, 74 respectively correspond to the source and drain of the type N channel transistor $T_4$, formed in a type P silicon substrate 76, whilst reference 78 corresponds to the gate of said transistor, more particularly made from a polycrystalline silicon.

In the same way, reference 82, 84 respectively represent the drain and the source of the channel P transistor $T_2$, e.g. formed in a type N silicon substrate 86, whilst reference 88 represents the gate of transistor $T_2$, particularly formed from polycrystalline silicon.

Moreover, reference 90 represents the field oxide separating transistors $T_2$, $T_4$ from one another.

Figure 5:
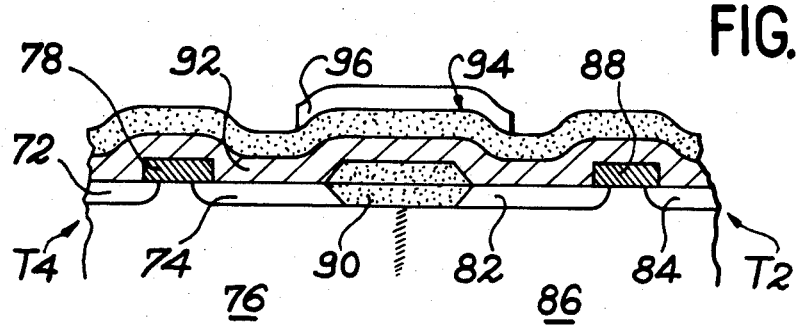
FIG. 5 to 8 in longitudinal section, the various stages of a process for producing a storage cell according to the invention.
Figure 8:
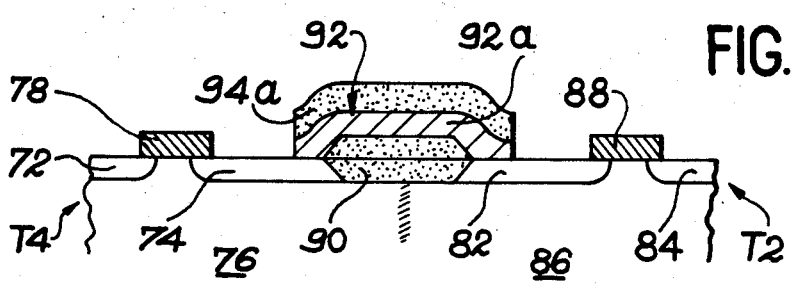

According to this process, the interconnection of drain 74 of transistor $T_4$ and drain 82 of transistor $T_2$ is brought about by directly depositing on the complete integrated circuit following the formation of the field oxide gates, drains, and sources of the said transistors, a layer 92 of a conductive material, e.g. an alloy of titanium and tungsten, as shown in FIG. 5, followed by the etching of said layer 92 in order to produce the desired connection 92a (FIG. 8).

Figure 6:
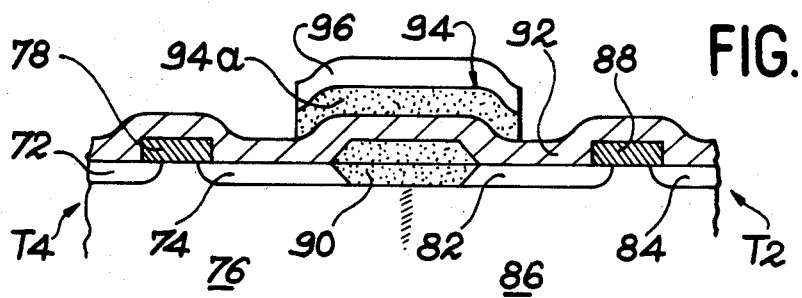

This layer 92 can be etched by firstly depositing on said layer 92 a layer 94 of another material, more particularly of aluminum. Then, as shown in FIG. 6, a resin mask 96 is produced and this represents the image of connection 92a to be formed. This is followed by eliminating that part of layer 94 not covered by mask 96, e.g. by using an anisotropic etching process.

Figure 7:
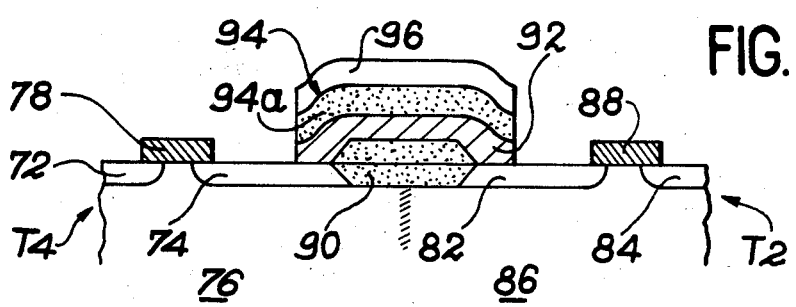

Then, as shown in FIG. 7, that part of layer 92 not covered by the remainder 94a of layer 94 is eliminated e.g. by using an anisotropic etching process, the remainder 94a of layer 94 serving as a mask for this etching operation.

Finally, as shown in FIG. 8, the resin mask 96 is eliminated.

Layer 92, which is more particularly an alloy of titanium and tungsten, when etched in this way makes it possible to connect drain 74 of the channel N transistor $T_4$ to drain 82 of the channel P transistor $T_2$.

Apart from its function as a mask for etching layer 92, the use of an aluminum layer 94 makes it possible to avoid, during subsequent operations, the oxidation of the titanium - tungsten alloy layer.

This process for connecting the drain of transistor $T_2$ to the drain of transistor $T_4$ is obviously applicable for obtaining all the internal connections of the storage cell according to the invention, without insulation, and particularly for obtaining connection 52 between the drain of transistor $T_1$ and the gate of transistor $T_2$, the connection 56 of the drain of transistor $T_2$, the drain of transistor $T_4$ and the gates of transistors $T_1$ and $T_3$, the connection 54 and 62 of the drain of transistor $T_3$ to the gate of transistor $T_4$ and to the drain of transistor $T_6$, as well as the connection 60 between the drain of transistor $T_5$ and the gate of transistor $T_3$.

The aforementioned connection process makes it possible, through eliminating the electric contacts within the storage cell according to the invention, to increase the integration density by 27% compared with the prior art cells.

It is possible to further increase the integration density of the storage cell by using a process making it possible to obtain an autoalignment or autopositioning of the uninsulated interconnection lines, on active zones and/or the gates to be interconnected, the process described hereinbefore not being an autoaligned process.

As an autoaligned or autopositioned process, it is in particular possible to use that described in French Pat. No. 2,562,327, filed in the name of the Applicant.

Moreover, contrary to the prior art cells, it is possible to increase the integration density by decreasing the distance separating the active zones of the different transistors of the cell to be connected, as a result of the absence of electric contact holes in said cell. This can be brought about by using an insulation process between the different transistors of the cell by an isolation trench, like that described in the article IEDM-82, published by IEEE, 1982, pp. 237 to 240, and entitled "Deep Trench Isolated CMOS Devices", by R. D. Rung, H. Momose and Y. Nagakubo instead of using a local field oxide.

What is claimed is:

1. A CMOS static storage cell comprising a bistable element formed from a first and a second P MOS transistor and from a third and fourth N MOS transistor, a fifth and a sixth channel N MOS transistor used for controlling the bistable element, the sources and drains of said six transistors being diffused in a semiconductor substrate and the gates of said six transistors being formed in a first conductive layer achieved on said substrate, wherein the transistors of the bistable element are electrically interconnected, so that:

the gates of said first and third transistors are interconnected by a first connection line formed in said first conductive layer;

the gates of said second and fourth transistors are interconnected by a second connection line formed in said first conductive layer;

the sources of said first and second transistors are connected to one another and to an electric power supply by a third connection line diffused in said substrate;

the sources of the third and fourth transistors are connected to earth, by respectively a fourth and a fifth connection line formed in a second conductive layer;

the drain of the first transistor is connected to the gate of the second transistor by a sixth connection line formed in a third conductive layer and which is in direct contact with said first transistor drain and with an extension of said second transistor gate;

the drain of the second transistor is connected to the gates of the first and third transistors as well as to the drain of the fourth transistor, by means of a seventh connection line formed in said third conductive layer and which is in direct contact with the drains of said second and fourth transistors and with an extension of said first connection line; and the drain of the third transistor is connected, in the bistable element, to the gate of the fourth transistor by an eighth connection line formed in said third conductive layer and which is in direct contact with said third transistor drain and with an extension of said fourth transistor gate.

2. A storage cell according to claim 1, wherein:

the drain of the fifth transistor is connected to the gate of the third transistor by a ninth connection line formed in said third conductive layer and which is in direct contact with said fifth transistor drain and with said third transistor gate;

the drain of the sixth transistor is connected to the gate of the fourth transistor, by a tenth connection line formed in said third conductive layer and which is in direct contact with said sixth transistor drain and with said fourth transistor gate;

the gates of the fifth and sixth transistor which are used for carrying the cell selection signals are interconnected by an eleventh connection line formed in said first conductive layer; and the sources of these fifth and sixth transistors are used for carrying the information to be stored or read, said information being introduced in the fifth and sixth transistor sources by respectively a twelfth and a thirteenth connection line formed in said second conductive layer.

3. A storage cell according to claim 1, wherein the first conductive layer is formed from polycrystalline silicon.

4. A storage cell according to claim 1, wherein the second conductive layer is formed from aluminum.

5. A storage cell according to claim 1, wherein the third conductive layer is formed from a titanium-tungsten alloy.

* * * * *